United States Patent [19]

McMullen et al.

[11] 4,197,561
[45] Apr. 8, 1980

[54] PORTABLE RECORDER APPARATUS FOR RECORDING TIME-RELATED DATA

[75] Inventors: John W. G. McMullen; Rex A. Wadham, both of Provo, Utah

[73] Assignee: Brigham Young University, Provo, Utah

[21] Appl. No.: 870,454

[22] Filed: Jan. 18, 1978

[51] Int. Cl.² .............................................. G11B 5/00
[52] U.S. Cl. ....................................................... 360/4
[58] Field of Search ........................................... 360/4

[56] References Cited
U.S. PATENT DOCUMENTS

| 3,832,733 | 8/1974 | Eldridge | 360/4 |
| 3,943,526 | 3/1976 | Albertini et al. | 360/4 |
| 3,944,796 | 3/1976 | Fitzpatrick | 360/4 |
| 3,956,740 | 5/1976 | Jones et al. | 360/4 |
| 3,983,577 | 9/1976 | Ito et al. | 360/4 |

Primary Examiner—Vincent P. Canney
Attorney, Agent, or Firm—Thorpe, North & Gold

[57] ABSTRACT

A portable data recorder for recording time-related information on tape cassettes. The recorder includes a briefcase shell in which the other components are mounted, a keyboard having a plurality of keys each of which, when depressed, produces a signal, and a plurality of key lines each coupled to a different one of the keys for carrying the signals produced thereby. A multiplexer, under control of a microprocessor, sequentially samples the key lines and transfers to the microprocessor any signals present on the key lines. The microprocessor then records on a cassette recorder data indicating whether or not a signal was present on each of the key lines sampled, and the time of sampling the key lines. The multiplexer successively samples the plurality of key lines so that both the identity of the keys depressed and the time duration of depression of the keys are recorded.

8 Claims, 6 Drawing Figures

PORTABLE RECORDER APPARATUS FOR RECORDING TIME-RELATED DATA

BACKGROUND OF THE INVENTION

This invention relates to a portable data recorder capable of recording information representing the time of occurrence and duration of a plurality of events.

One approach to improving performance skills of an activity, whether the activity be teaching, working on an assembly line, secretarial work, etc., is to in some fashion record what occurs during the activity and then use the recorded information to provide feedback to the person performing the activity. This feedback might simply involve identifying different events which occurred in the activity, and providing instruction regarding what events should be avoided, utilized, reduced in frequency, increased in frequency, etc.

Recording what occurs during an activity has most often involved the use of a pencil and a tally sheet on which different possible events of the activity are cataloged. The activity is then observed and the observer checks or makes a mark on the tally sheet beside an event when he observes the occurrence of the event. This recording method is very cumbersome and inaccurate especially if the observed activity involves the simultaneous occurrence of several events. Also, it is difficult to keep track of and record by hand such time-related information as (1) frequency of occurrence of multiple events, (2) duration of the events, (3) latency or time elapsed between events, (4) sequence of occurrence of events, and (5) simultaneity and time overlap of events. All of this type information has been found useful in providing instruction in the improvement of skills and the performance of activities.

Several data collection devices have been developed as alternatives to the hand recording of observational information. Such devices include a data terminal manufactured by Azur Data Incorporated and a data collection device manufactured by Electro/General Corporation. The first-mentioned data terminal includes a keyboard, an LED display, a solid-state memory for temporarily recording information keyed on the keyboard, and circuitry which enables transmitting information from the terminal to a computer using a standard telephone. Apparently no time-related information can be recorded other than information identifying the sequence in which keys are depressed (or events occur). The Electro/General data collection device also includes a keyboard, an LED display, a solid state memory, and circuitry for enabling transmission of information to a computer. In addition, certain kinds of time-related information can be recorded such as elapsed time for keying in information.

The primary drawback of prior art recording devices is that only very limited kinds of time-related data can be recorded. None of the devices known to the inventors hereof can record the five types of time-related data enumerated above. As indicated earlier, all such types of data have been found useful for instructional purposes.

SUMMARY OF THE INVENTION

It is an object of the present invention to provide a compact, portable data recorder for recording time-related data.

It is another object of the invention to provide such a data recorder capable of recording the frequency, time duration, and time elapsed between the occurrence of events.

It is still another object of the invention to provide such a data recorder which can be utilized by one observer to record the simultaneous occurrence of multiple events.

It is a further object of the invention, in accordance with one aspect thereof, to provide a data recorder capable of recording time-related data on a conventional cassette recorder.

It is also an object of the invention, in accordance with another aspect thereof, to provide a data recorder which may be synchronized with other similar data recorders to enable utilizing the recorders simultaneously for recording data in the same time frame.

The above and other objects of the invention are realized in a specific illustrative embodiment of a data recorder which includes a keyboard having a plurality of keys, and a plurality of key lines each connected to a different key. The key lines are coupled to a multiplexer which, in turn, is coupled to a data processor. Also included is recording apparatus and apparatus for producing time information. When any key is depressed, a signal is produced on a corresponding line and this signal is maintained while the key is depressed. The data processor periodically and successively samples the key lines via the multiplexer and then records in the recording apparatus indications of the presence or absence of signals on the key lines and the time at which the key lines were sampled. In this manner, time-related information concerning observable events may be recorded simply by depressing selected keys which have been designated to represent different events. Such information includes frequency and duration of events, time elapsed between events, sequence of events, and simultaneity and time overlap of events.

In accordance with one aspect of the present invention, apparatus is provided for coupling a plurality of data recorders together to synchronize the time apparatus and thereby enable collecting and recording data simultaneously on the recorders in the same time frame.

BRIEF DESCRIPTION OF THE DRAWINGS

The above and other objects, features and advantages of the present invention will become apparent from a consideration of the following detailed description presented in connection with the accompanying drawings in which.

DETAILED DESCRIPTION

Figure 1:
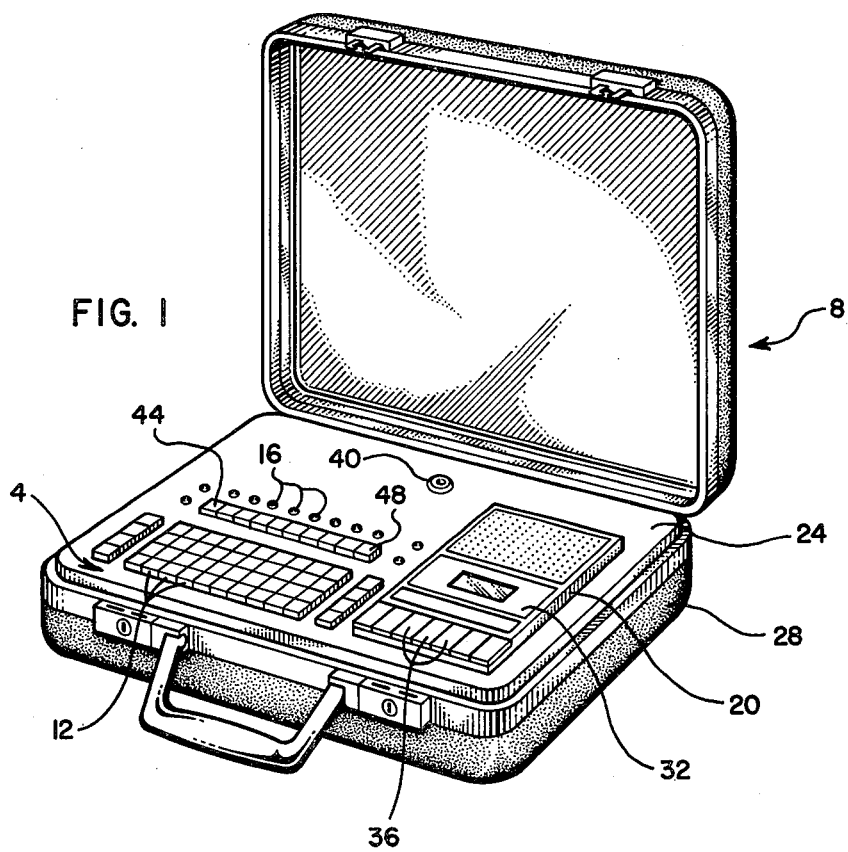
FIG. 1 is a perspective view of a briefcase containing recorder apparatus made in accordance with the principles of the present invention.

FIG. 1 shows a perspective view of recorder apparatus 4 contained in a conventional briefcase shell 8. The recorder apparatus includes a keyboard having a plurality of keys 12, a plurality of lamps 16 or other light emitting devices, some of which are located above corresponding related keys, and a cassette recorder 20, all mounted in a cover plate or wall 24 fitted within a bottom portion 28 of the shell 8. Control and interface circuitry for the keys 12, lamps 16 and cassette recorder 20 is disposed under the cover plate 24.

The cassette recorder 20 is a conventional recorder having a cassette receptacle 32 into which is placed a tape cassette for recording time-related information keyed on the keys 12. The cassette recorder 20 includes the standard control keys 36 for controlling movement of the cassette tape (fast forward, rewind, etc.), and recording and playback.

Located in the cover plate 24 is a jack opening 40 for receiving a plug. This allows connecting the recorder apparatus 4 to other similar recorder apparatus to enable synchronizing all the apparatus so that they can be used "in parallel" to record data in the same time frame. In other words, the time at which data is recorded on one recorder apparatus is synchronized and consistent with the time data is recorded on other recorder apparatus so that over some predetermined period, the time of recording any data item from any recorder apparatus can be determined relative to all other data.

As will be discussed in more detail later, the operation of the recorder apparatus 4 is carried out under control of a microprocessor. It is desirable that the user of the apparatus be able to reset the microprocessor at any time, but that such resetting not occur accidentally such as during a data collection session. Keys 44 and 48 are provided to reset the microprocessor, and both keys must be depressed at the same time to effect resetting. Note that the two keys are physically spaced apart and separated by other keys. This reduces the chance of an accidental, simultaneous depression of the two keys and thus the possibility of accidental resetting.

The other keys 12 of the recorder apparatus are used for entering information or data on the cassette recorder 20 about activities being observed. Before beginning such observation, different ones of the keys are assigned to represent different events or possible occurrences. In observing teacher/pupil activities in a classroom, for example, such events or occurrences might include "teacher questioning," "teacher instructing," "teacher explaining," "pupil asking question," "pupil responding to teacher question," etc. The keys are appropriately labeled to identify the events which they represent so that the user can readily locate the appropriate keys. When an event begins, the user depresses the key representing that event and maintains the key in the depressed condition during the time the event subsists. Information as to the keys depressed and the time and duration of depression is recorded on the cassette recorder 20 for later use in analyzing the observed activity, providing feedback to the participants, etc.

Figure 2:
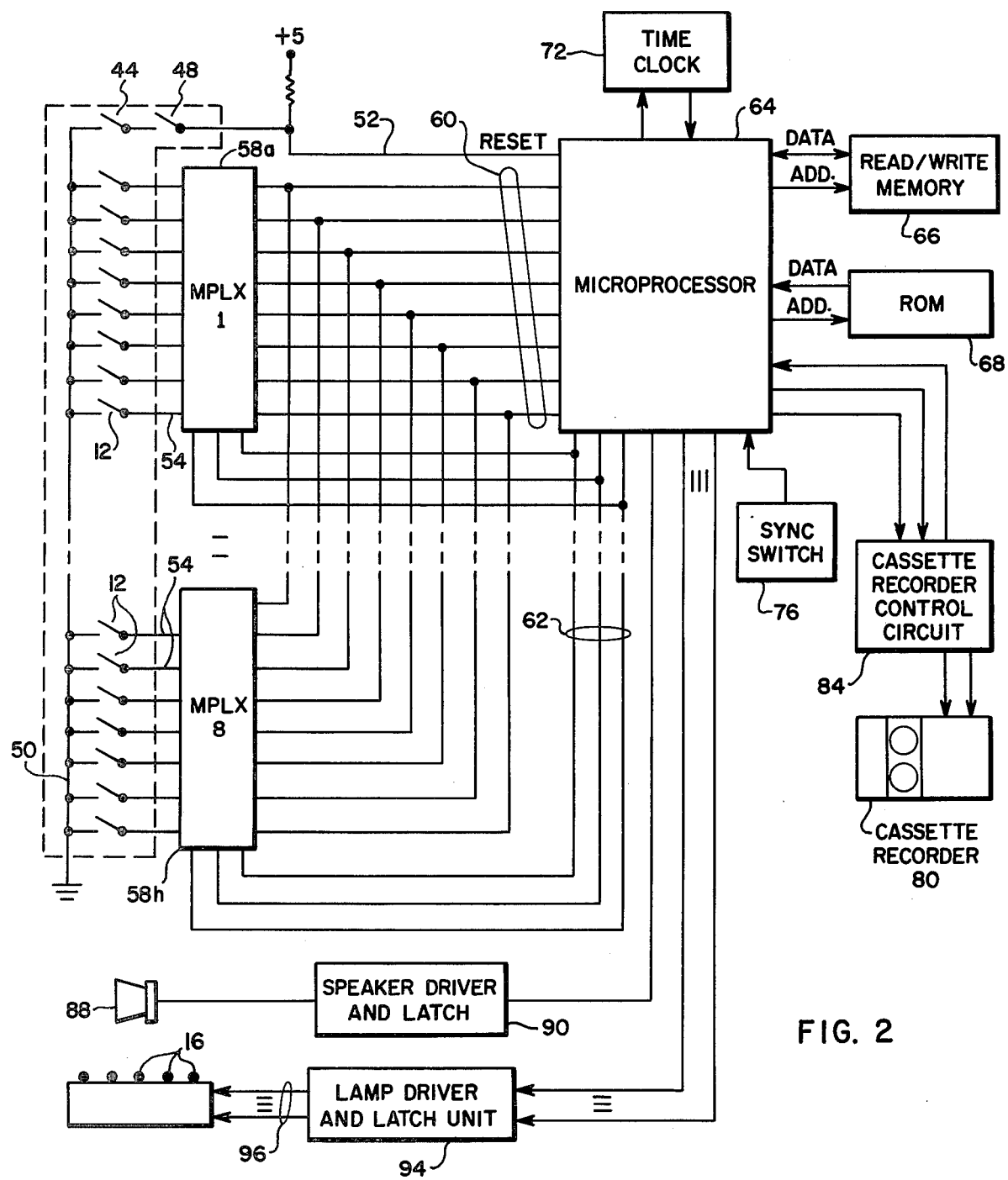
FIG. 2 is a circuit schematic of recorder apparatus of the present invention.

FIG. 2 is a circuit schematic of the recorder apparatus of the present invention. The apparatus includes the keys 12, mentioned earlier, represented in FIG. 2 as switches. (Depression of a key causes closure of the corresponding switch.) Each key or switch 12 is coupled to a ground line 50 and to a corresponding key line 54. The key lines, in turn, are coupled to a corresponding one of eight multiplexers 58a through 58h (only two of the multiplexers being shown in FIG. 2). The multiplexers 58a-58h are coupled by a data bus 60 to a microprocessor 64 which controls operation of the multiplexers 58a-58h and the other components of the recorder apparatus. The multiplexers 58a-58h are also coupled by way of a control bus 62 to the microprocessor 64.

The microprocessor 64 could be any of a variety of microprocessors available on the market including the so-called SC/MP microprocessor produced by National Semiconductor, Inc.

The two reset keys or switches 44 and 48 are shown connected in series between ground and the microprocessor 64. When the two switches are closed at the same time, ground potential is applied to reset lead 52 connected to the microprocessor, and this serves to reset the microprocessor as before discussed.

Also coupled to the microprocessor 64 is a random access, read/write memory 66 for temporarily storing data being processed by the microprocessor, and a read only memory (ROM) for storing the programs which determine the operation of the microprocessor. The microprocessor 64 identifies locations in the ROM 68 from which program instructions are to be read by supplying the addresses of those locations to the ROM over an address bus (shown as a single line in FIG. 2), and then data containing those instructions is supplied to the microprocessor over a data bus (also shown as a single line). Similarly, locations in the read/write memory 66 into which data is to be written or from which data is to be read over a data bus (shown by a single line) are identified by addresses supplied over an address bus (shown as a single line).

A clock 72 is coupled to the microprocessor 64 to supply time information or signals for use in recording the time of sampling the keys, as will be explained later. The clock 72 is resettable and free running to produce signals indicating the time, not necessarily actual time but rather time measured over an observation period. A synchronization switch 76 is also coupled to the microprocessor to enable synchronizing the time clock 72 with time clocks of other recorder apparatus so that all such recorder apparatus can operate in parallel on the same time frame. This is done by simultaneously signalling all synchronization switches to in turn signal the corresponding microprocessors. The microprocessors then reset the corresponding time clocks to beginning timing all at the same time.

The recorder apparatus of FIG. 2 further includes a conventional cassette recorder 80 coupled by way of a cassette recorder control circuit 84 to the microprocessor 64. Data to be recorded is applied via the control circuit 84 to the cassette recorder 80 for recording on a tape cassette inserted in place in the cassette recorder.

A speaker 88 is provided to audibly notify the user of the depression of keys, occurrence of errors, etc. The speaker 88 is operated by a conventional driver and latch circuit 90 which responds to a signal from the microprocessor by applying an oscillatory signal burst to drive the speaker. The lamps 16 (or other light-emitting devices) were discussed earlier and are shown coupled to a lamp driver and latch unit 94 which, in turn, is coupled to the microprocessor. The lamp driver and latch unit 94 receives data from the microprocessor 64 identifying which lamp is to be lighted, and then generates a current signal on the appropriate one of lines 96 for lighting the corresponding lamp connected to such line. The operation of the recorder apparatus of FIG. 2 will now be described.

The recorder apparatus of FIG. 2 is initialized by closing the reset switches 44 and 48 (i.e., depressing keys 44 and 48 of FIG. 1) which places a ground potential on reset lead 52 indicating to the microprocessor 64 that the user desires to begin data collection. The microprocessor 64 then applies data to the lamp driver and latch unit 94 causing the lamp driver and latch unit to light specific ones of the lamps 16 to notify the user as to what action may next be taken. This action could be the keying of information to indicate the time period over which data collection is to be made, test procedures to determine if the keys or switches 12 are operating properly, and the keying of information to identify the specific activity to next be observed. Each time such keying occurs, the microprocessor 64 applies data to the lamp driver and latch unit 94 to light appropriate ones of the lamps 16 to indicate that the action taken was either proper or improper, and to indicate what action should next be taken. Ultimately, a lamp would be lighted to indicate to the user that data relating to observed events may be entered on the recording apparatus.

Each time one of the switches 12 is closed, the microprocessor 64 detects this and applies a signal to the speaker drive and latch 90 to cause production of an audible signal by the speaker 88. This audible signal provides assurance to the user that the key depression was properly detected by the microprocessor. This is not necessary for proper operation but it has been found desirable as reassurance to the user that the keys are being properly depressed and detected by the microprocessor.

When the user observes an event which he wishes to record in the recording apparatus, he closes an appropriate one of the switches 12 (depresses a key) and maintains the switch closed (maintains the key depressed) as long as the event subsists. Of course, if multiple events are occurring, then he closes multiple switches to represent the occurrence of these events. Closing a switch 12 places a ground potential on a corresponding one of the lines 54 leading to the multiplexers 58a–58h, i.e., conducts to ground a voltage normally present on the lines (such voltages are applied to the lines within the multiplexers and so are not shown).

The microprocessor 64 samples each of the lines 54 in succession by first selecting one of the eight multiplexers 58a–58h by applying appropriate control signals to the control bus 62 to identify the selected multiplexer. The selected multiplexer and only the selected multiplexer responds to the particular control signals by connecting its eight key lines 54 to the eight lines of the data bus 60. Each of the other multiplexers respond to a different set of control signals applied to the control bus 62 by connecting the key lines of that multiplexer to the lines of the data bus 60. With the key lines 54 of a particular multiplexer connected to the data bus lines 60, the microprocessor 64 can then sample the data bus lines to ascertain the presence or absence of ground potential on the lines. The presence or absence of ground potential on the lines, plus the time at which the lines are examined as read by the processor from the time clock 72, is recorded in read/write memory 66. The microprocessor 64 then enables the next multiplexer in the series to connect its key lines to the lines of the data bus 60 so that the microprocessor can examine those lines and record in the read/write memory 66 information as to the status of the corresponding switches 12. This continues until each of the key lines 54 has been sampled, after which the process begins again. In this manner, each of the key lines 54 is examined in succession and the status of the line is recorded along with the time of examination of the line. Of course, the particular sequence in which the key lines are examined is unimportant and there are a variety of sequences in which the microprocessor 64 might "look" at the lines. One such particular way will be discussed later.

After a certain amount of information about the key lines 54 and the times of sampling has been written into the read/write memory 66, the microprocessor 64 applies a signal via the cassette recorder control circuit 84 to the cassette recorder 80 to start the recorder and then it reads the collected information from the read/write memory 66 and applies it to the cassette recorder control circuit for application to the cassette recorder. The information, which includes data as to which keys were depressed during the course of observing the activity and the time and duration of depression, is then recorded sequentially on cassette tape. The cassette tape can later be processed by a general purpose computer and a print out of the information prepared showing frequency of occurrence of events, duration of events, etc.

Figure 5A:
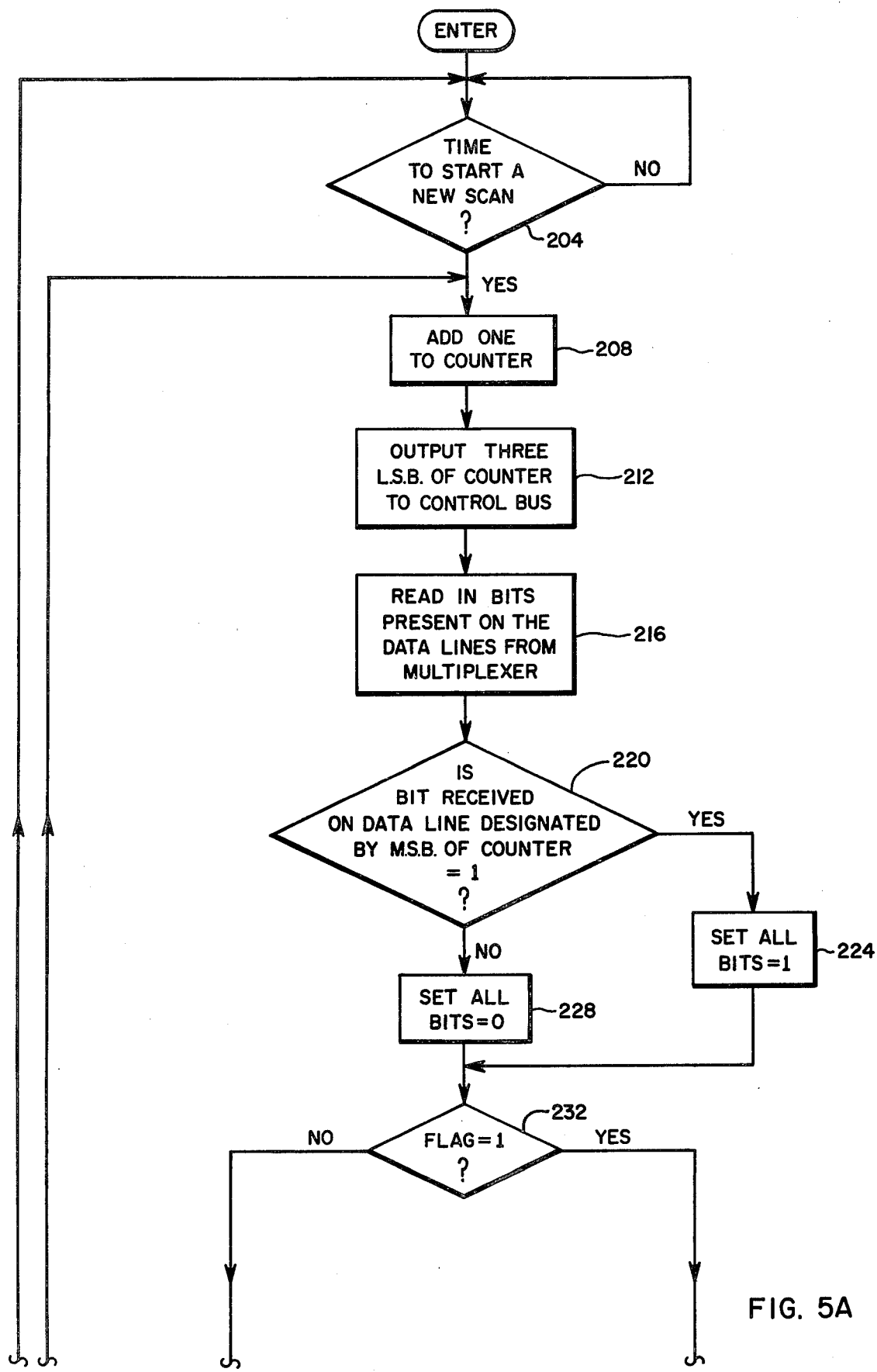
FIGS. 5A and 5B show a flow diagram illustrating the operation of the microprocessor and recorder apparatus of the present invention.
Figure 5B:
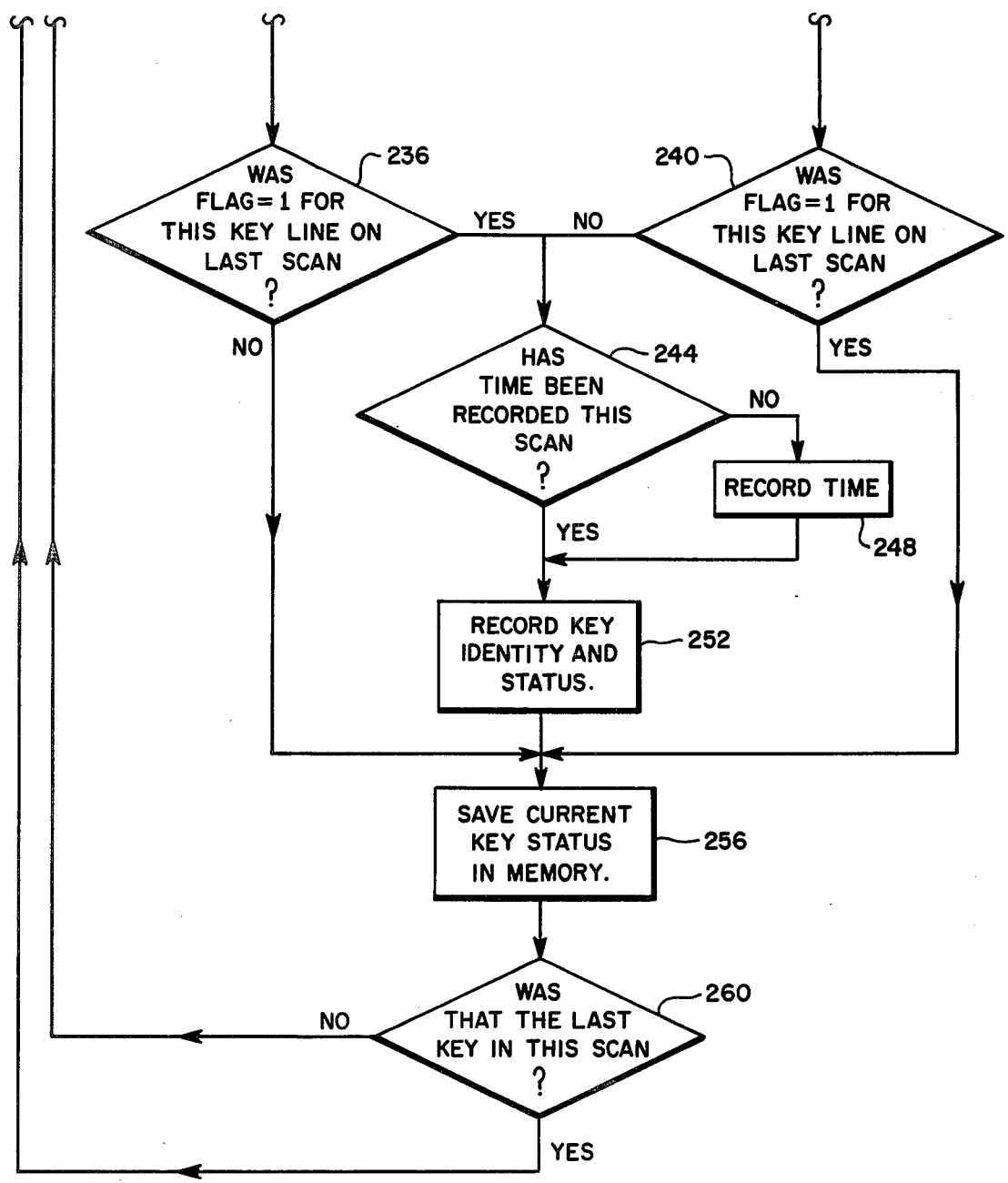

FIGS. 5A and 5B show a flow diagram of an exemplary sampling process performed by the microprocessor 64. The first step of the process is to determine if it is time to start a new scan of the key lines 54, as indicated by block 204. Advantageously, a new scan of the key lines might begin every 0.1 seconds and so if it is not time to begin a new scan, the process simply delays for a time and then again makes the inquiry. If it is time to begin a new scan, the microprocessor adds a one to an internal counter (block 208) used by the microprocessor to identify which key line is to be examined. This internal counter is a six-bit counter in which the three least significant bits identify which of the eight multiplexers 58a–58h is to be enabled, and the three most significant bits identify which data line from the selected multiplexer is to be examined. By counting from zero to sixty-three, the six-bit counter successively identifies each of the sixty-four key lines 54 (FIG. 2) to be examined by the microprocessor. After the counter has been incremented by one (block 208) the microprocessor applies the three least significant bits of the internal counter to the control bus 62 for application to the multiplexers (block 212). A particular one of the multiplexers is enabled by these three bits to connect the corresponding key lines of that multiplexer to the data bus 60, and then the microprocessor reads the contents of the key lines of that multiplexer (block 216). The bits on the data bus are either "zeros" (ground voltage level) or "ones" (positive voltage level).

The microprocessor next looks at the bit of the data line designated by the three most significant bits of the internal counter to ascertain if this bit is equal to one (block 220). If the examined bit is equal to one, then all other bits received from the multiplexer are set to one (block 224), and if the examined bit is not equal to one, i.e., if it is equal to zero, then all other bits are set equal to zero (block 228). The purpose of this is simply to provide a flag which identifies the status of the examined key line. A determination is next made as to whether the flag is equal to one (block 232), that is, whether all of the bits are equal to one or equal to zero and thus whether the key line being examined carried a "one" or a "zero". After this determination is made, the microprocessor determines whether the key line in question changed status from the last scan of that key line. This is done simply by comparing the present status, i.e., the value of the flag, with the value determined at the last scan which is saved in memory. If the status has been changed, as determined at either block 236 or block 240, then the microprocessor determines whether the time of initiation of the present scan has been recorded (block 244). If the time has not been recorded, then the microprocessor records the time (block 248) and also records the identity of the key line being examined and the present status of the key line. If the key line status did not change, then the current status, already stored in read/write memory 66, is saved (block 256). In this manner, the key line status is recorded only when a change occurs and the time of sampling is recorded once per scan if a status change occurs.

After whatever recording takes place, a determination is made as to whether the key line examined was the last key line in the scan (block 260) and if it was, the process returns to block 204, otherwise the process returns to block 208 where the internal counter is incremented by the one to identify the next key line to be examined and the process is repeated.

The scanning process described is one of a variety which could be implemented to determine which keys of the recorder apparatus have been depressed and the time and duration of such depression.

Figure 3:
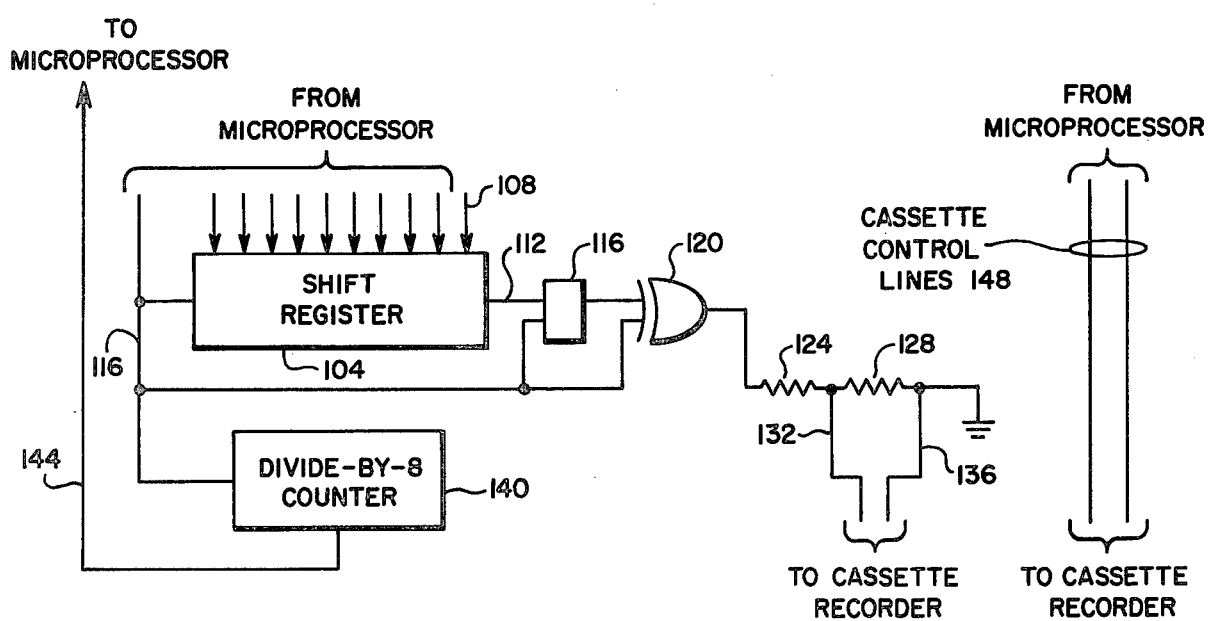
FIG. 3 is a circuit schematic of the cassette recorder control circuit of FIG. 2.

FIG. 3 of the drawings shows exemplary circuitry for the cassette recorder control unit 84 of FIG. 2. The circuitry includes a shift register 104 for receiving an eight bit data word in parallel from the microprocessor. Such data words include either time information or information as to the identity of keys depressed. The data words are written into the shift register 104 in response to a strobe signal applied to line 108 from the microprocessor. The information is then shifted onto line 112 from the shift register in response to shift pulses from the microprocessor applied to line 116. The contents of the shift register 104 are shifted first to a one bit buffer 116 and from there to an Exclusive-Or gate 120. The shift pulses applied to lead 116 by the microprocessor also serve as an input to the Exclusive-Or gate 120. The output of the Exclusive-Or gate 120 is high when the input data and shift signals are different (shift signal high and input data low or shift signal low and input data high) and the output is low if the input data and shift signals are the same (both shift signal and input data high or both low). This output, which constitutes phase encoded information, is applied to a pair of resistors 124 and 128 connected in series. A pair of lines 132 and 136 are connected on either side of the resistor 128 and to the cassette recorder 80 of FIG. 2. The two lines 132 and 136 are simply connected to the microphone input of a conventional cassette recorder. The phase encoded data thus applied to the resistors 124 and 128 is applied to and recorded on cassette tape of the cassette recorder.

As each bit of an eight bit word is shifted from the shift register 104 in response to shift pulses applied to lead 116, a divide by eight counter 140 is incremented. After eight such shift pulses have been received by the counter 140 (indicating that the eight bits of the data word applied to the shift register 104 had been shifted therefrom), the counter 140 produces a signal on line 144 and this is applied to the microprocessor 64. This signal serves to notify the microprocessor that another data word may be applied to the shift register 104 for application to the cassette recorder. The microprocessor then applies such a data word in parallel to the shift register 104, as before discussed, for serial application to the cassette recorder.

Control lines 148 are shown in FIG. 3 interconnecting the microprocessor and the cassette recorder. These lines control the starting and stopping of movement of the cassette tape to enable recording of data thereon. The microprocessor simply shorts the two control lines together to start movement of the tape and then disconnects the two lines to stop tape movement. This is a conventional connection to a standard cassette recorder.

Figure 4:
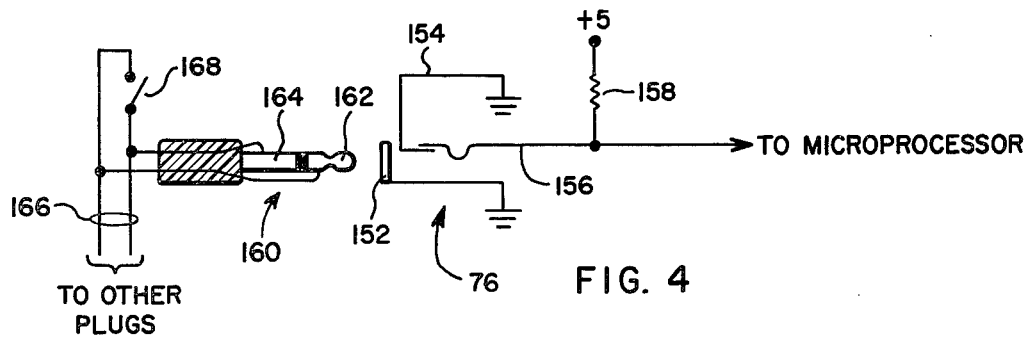
FIG. 4 is a diagrammatic showing of the synchronization switch of FIG. 2 and connecting line therefor.

FIG. 4 shows the circuitry for the synchronization switch 76 of FIG. 2. In particular the circuitry is shown by numeral 76 to include a conventional jack having a grounded ring 152, another grounded stationary element 154, and a movable element 156 coupled via a resistor 158 to a voltage source. The movable element 156 is also coupled to the microprocessor.

Also shown in FIG. 4 is a conventional plug having a tip 162 which is electrically insulated from a shank 164. The tip 162 and shank 164 are connected to different wires of a wire pair 166. A manually operable switch 168 is provided to connect the two wires 166 together.

When the plug 160 is inserted into the jack 76, the tip 162 engages the movable element 156 causing it to disengage from element 154. The shank 164 of the plug makes electrical contact with the ring element 152 of the jack. The two lines 166 are coupled to other plugs similar to plug 160 which would be used to plug into other recorder apparatus to by synchronized with the recorder apparatus of the drawings.

When the plug 160 is plugged into the jack 76, and the switch 168 is open, a positive voltage is applied via resistor 158 to the microprocessor to signal the microprocessor not to reset the time clock 72 (FIG. 2). When the switch 168 is closed, a conduction path is established between the movable element 156 and the ring 152 of the jack 76 and of all other jacks into which plugs connected to lines 166 have been plugged. This conducting path shorts the voltage source to ground to cause a low signal to be applied to the microprocessor indicating that the time clock 72 is to be reset. In this manner, the microprocessors of all recording apparatus which are to be synchronized are signalled by the closing of switch 168 to reset corresponding time clocks at the same time so that all recording apparatus will be synchronized to operate in the same time frame.

Recording apparatus has been described which facilitates recording on a conventional cassette recorder time-related data keyed by a user on a simple push-button keyboard. The apparatus enables recording information as to the frequency of occurrence of events observed, the duration of such events, the time between occurrence of the different events, the sequence in which the events occur, and the simultaneity of events, i.e., time overlap. A plurality of such recorder apparatus may be connected together and synchronized as to the time frame over which the data recording takes place.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. Self-Contained recorder apparatus for recording time-related data comprising
   a keyboard having a plurality of key means, each for producing a signal during the time the key means is operated, a plurality of key lines, each coupled to a different one of said key means for carrying signals produced by the corresponding key means, a data bus, multiplexer means for sequentially sampling said key lines and for applying to said data bus the signals present on the key lines during sampling, means for recording data applied thereto, clock means for producing indications of elapsed time, and processor means coupled to said data bus, said multiplexer means, and said clock means for applying to said recording means data indicating the time of sampling the key lines, and data indicating whether or not a signal was present on each key line when sampled, said recorded data thereby indicating which of the key means has been operated and the elapsed time of operation of each key means.

2. Apparatus as in claim 1 wherein said recording means comprises a cassette recorder adapted to record on a cassette tape data applied to the recorder.

3. Apparatus as in claim 2 wherein said recording means further comprises a cassette recorder control circuit which includes register means for registering data words received in parallel from said processor means, means for applying the data words serially to the cassette recorder, and means for signalling said processor means upon completion of application of each data word to the cassette recorder.

4. Apparatus as in claim 3 wherein said data word applying means comprises buffer means coupled to the output of said register means for temporarily storing data bits of said data words, an exclusive-or gate, one of whose inputs is coupled to the output of said buffer means, and clock means coupled to the other input of said exclusive-or gate, the output of the exclusive-or gate being coupled to said cassette recorder.

5. Apparatus as in claim 1 wherein said clock means is resettable by said processor means to begin timing from a predetermined reference time, said apparatus further comprising jack means having first and second elements, and means for applying a synchronization signal to said processor means when said first and second elements are electrically connected to thereby indicate that the processor means is to reset the clock means, a plurality of plug means, each insertable in a jack means and each having first and second contacts for electrically contacting said first and second elements respectively of a jack means into which the plug means is inserted, and switch means coupled to each of said plug means and operable to electrically connect together the first and second contacts of each of said plug means.

6. Apparatus as in claim 1 further comprising first and second reset key means spaced apart from one another and connected in a series relationship, and means for supplying a reset signal to said processor means when said first and second reset key means are operated simultaneously.

7. Apparatus as in claim 1 further comprising an audible sound producing means, and means for energizing said sound producing means in response to a signal from said processor means when any of the key means is operated.

8. Apparatus as in claim 1 further comprising a plurality of light producing means and means responsive to signals from said processor means identifying selected ones of said light producing means for energizing the selected light producing means.

* * * * *